United States Patent [19]

Ohkubo et al.

[11] Patent Number: 5,053,650
[45] Date of Patent: Oct. 1, 1991

[54] MONOLITHIC SEMICONDUCTOR INTEGRATED CIRCUIT DEVICE HAVING CURRENT ADJUSTING CIRCUIT

[75] Inventors: Yuichi Ohkubo, Takasaki; Satoru Sekiguchi, Osato; Toshihiko Watanabe; Nobuaki Yoneya, both of Takasaki, all of Japan

[73] Assignees: Hitachi, Ltd.; Hitachi Microcomputer Engineering Ltd., both of Tokyo, Japan

[21] Appl. No.: 457,308

[22] Filed: Dec. 26, 1989

[30] Foreign Application Priority Data

Dec. 27, 1988 [JP] Japan .................. 63-330002

[51] Int. Cl.$^5$ .................. H03K 5/00; H03B 1/00
[52] U.S. Cl. .................. 307/521; 328/167; 307/270; 381/98
[58] Field of Search .......... 307/521, 270; 328/167; 323/315, 316; 330/257; 381/97, 98

[56] References Cited

U.S. PATENT DOCUMENTS

| | | | |
|---|---|---|---|
| 4,374,335 | 2/1983 | Fukahori et al. | 307/521 |
| 4,818,903 | 4/1989 | Kawano | 307/521 |
| 4,849,663 | 7/1989 | Kunze et al. | 307/521 |
| 4,851,719 | 7/1989 | Hitomi | 307/521 |
| 4,859,881 | 8/1989 | Yamamoto et al. | 328/167 |
| 4,888,502 | 12/1989 | Jarrett | 307/521 |

FOREIGN PATENT DOCUMENTS 63-193710 9/1988 Japan .

OTHER PUBLICATIONS

Practical Electronic Circuit Handbook (2), Oct. 20, 1975, CQ Publishing Co., Ltd., pp. 281-289.

Primary Examiner—Stanley D. Miller
Assistant Examiner—Richard Roseen
Attorney, Agent, or Firm—Fay, Sharpe, Beall, Fagan, Minnich & McKee

[57] ABSTRACT

A monolithic semiconductor integrated circuit device includes a differentially operative circuit section, an amplifying element connected to define a current flowing in the differentially operative circuit section and a circuit for adjusting a current flowing in the amplifying element to thereby compensate for variations of electric characteristics from one semiconductor device to another. The current adjusting circuit includes at least one amplifying element and a load resistance for the amplifying element in the current adjusting circuit. The load resistance has a structure suitable for a trimming operation to adjustably determine the resistance value of the load resistance. The amplifying elements are in a current mirror circuit connection with their control electrodes being concerned with each other so that the electric current flowing in the current path between the current receiving and delivering electrodes of the amplifying element connected to define the current flowing in the differentially operative circuit section is controlled by the adjustably determined resistance of the load resistance.

27 Claims, 6 Drawing Sheets

F I G. 1
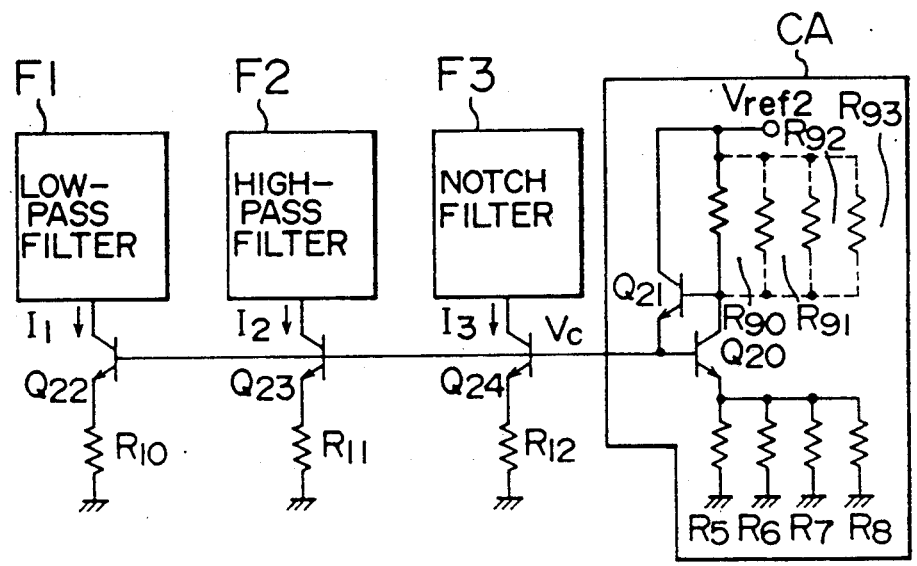
F I G. 2A
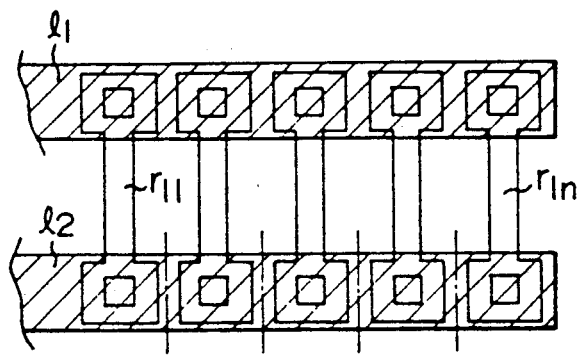
F I G. 2B
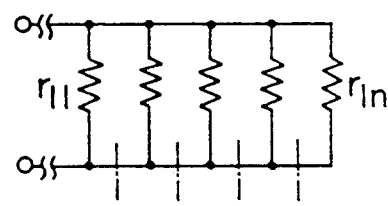
F I G. 2C
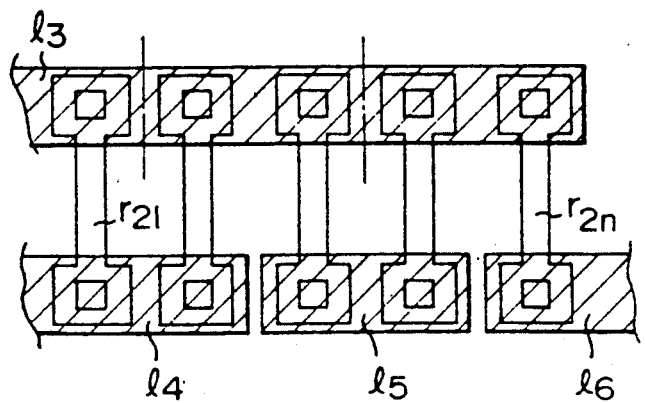
F I G. 2D
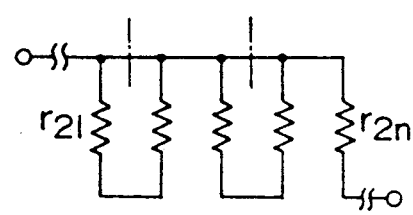

MONOLITHIC SEMICONDUCTOR INTEGRATED CIRCUIT DEVICE HAVING CURRENT ADJUSTING CIRCUIT

BACKGROUND OF THE INVENTION

The present invention relates to a semiconductor integrated circuit device, and more particularly to a monolithic semiconductor integrated circuit device including an audio signal processing circuit.

When circuit elements of a circuit dealing with an audio signal, for example a filter circuit, are incorporated in a semiconductor integrated circuit, a time constant of the filter circuit has manufacturing variations. For example, the resistance value of a resistor element has a variation of about ±25% and the capacitance value of a capacitor has a variation of about ±30%. As a result, the time constant of a time constant circuit including such resistor element and capacitor has a large variation of about ±60%. Especially, in the case where two or more filter circuits having such large variations are involved in a semiconductor integrated circuit, the possession of the above-mentioned variation by each filter circuit does not give assurance that no reliability for the electric characteristic of the overall system is lost.

A basic circuit for a filter has been disclosed in, for example, "PRACTICAL ELECTRONIC CIRCUIT HANDBOOK (2)" published by CQ Publishing Co., Ltd. on Oct. 20, 1975, pp. 281-289. In the active filter circuit, time constant circuit elements including a capacitor C and a resistor R are constructed by external parts in order to suppress the variation of a cut-off frequency of the filter circuit.

On the other hand, in order to improve the high-frequency performance of a transistor included in an integrating circuit, JP-A-63-193710 (laid open on Aug. 11, 1988) has proposed to make an emitter current of the transistor as large as possible for the purpose of increasing a transition frequency of the transistor. The proposed integrated circuit includes a differential amplifier and is provided with a terminal for supplying a signal which controls the emitter current of a transistor forming the differential amplifier.

SUMMARY OF THE INVENTION

An object of the present invention is to provide a monolithic semiconductor integrated circuit device including an audio signal processing circuit, in which variations of electric characteristics from one chip to another can be compensated for with a simple construction.

Another object of the present invention is to provide a monolithic semiconductor integrated circuit device in which compensation for variations of filter characteristics can be made with a simple construction.

According to one aspect of the present invention, a monolithic semiconductor integrated circuit device includes a differentially operative circuit section, an amplifying element connected to define a current flowing in the differentially operative circuit section and a circuit for adjusting a current flowing in the amplifying element to thereby compensate for variations of electric characteristics from one semiconductor device to another. The current adjusting circuit includes at least one amplifying element and a load resistance for the amplifying element in the current adjusting circuit. The load resistance has a structure suitable for a trimming operation to adjustably determine the resistance value of the load resistance. The amplifying elements are in a current mirror circuit connection with their control electrodes being connected with each other so that the electric current flowing in the current path between the current receiving and delivering electrodes of the amplifying element connected to define the current flowing in the differentially operative circuit section is controlled by the adjustably determined resistance of the load resistance.

According to another aspect of the present invention, a monolithic semiconductor integrated circuit device includes a plurality of filter circuits. Each filter circuit includes a pair of differentially operative transistors and a cut-off frequency of the filter circuit is changed by controlling an emitter current of the transistor pair. Amplifying elements dealing with the emitter current are in a current mirror circuit connection which receives an adjustable control current through a resistor-trimming operation. The emitter currents of the differentially operative transistor pairs are adjusted en bloc through the resistor-trimming operation so that the cut-off frequencies of the respective filter circuits are corrected en bloc.

With the above construction, the time constants of the respective filter circuits can be readily made identical with each other by the resistor-trimming operation at one location since the characteristics of circuit elements formed in one chip have substantially the same deviation.

BRIEF DESCRIPTION OF THE DRAWINGS

FIG. 1 is a schematic circuit diagram of a monolithic semiconductor integrated circuit device according to an embodiment of the present invention.

FIGS. 2A to 2D are diagrams showing examples of the structure of load resistor means for amplifying means in a current adjusting circuit shown in FIG. 1.

DESCRIPTION OF THE PREFERRED EMBODIMENTS

Figure 3A:
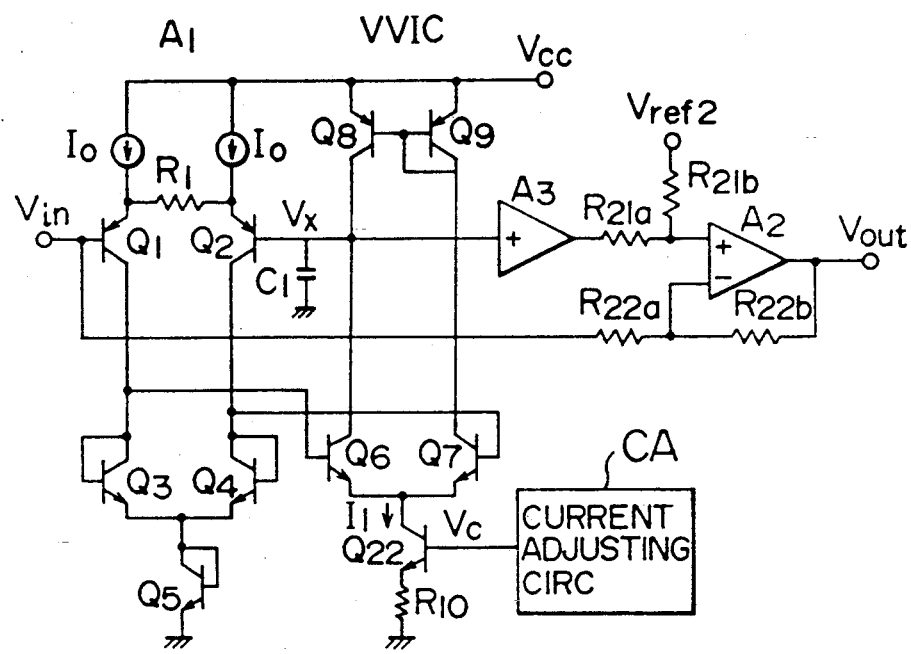
FIGS. 3A and 3B are a circuit diagram and a block diagram of a monolithic semiconductor integrated circuit device including a filter circuit according to an embodiment of the present invention.

FIG. 1 shows a circuit diagram of a main part of a monolithic semiconductor integrated circuit according to an embodiment of the present invention. Circuit blocks and circuit elements shown in the figure are formed by means of known semiconductor circuit fabrication techniques on a single semiconductor substrate which may be a monocrystalline silicon substrate.

In the present embodiment, the electric characteristics of filter circuits indicated by blocks (that is, a low-pass filter $F_1$, a high-pass filter $F_2$ and a notch filter $F_3$), for example, the cut-off frequencies (or time constants) thereof can be respectively adjusted by currents $I_1$, $I_2$ and $I_3$ which are set by a current adjusting circuit CA. Detailed explanation of such filter circuits will be made later.

The current adjusting circuit CA includes at least one amplifying element (first amplifying element) or NPN transistors $Q_{20}$ and $Q_{21}$ in the shown example, a collector load resistor $R_{90}$ for the transistor $Q_{20}$ and emitter load resistors $R_5$ to $R_8$ for the transistor $Q_{20}$. The collector and base of the transistor $Q_{20}$ are connected with the base and emitter of the transistor $Q_{21}$, respectively. The collector of the transistor $Q_{21}$ is connected with a terminal of a reference voltage $V_{ref}$. The collector resistor $R_{90}$ is connected between the collector of the transistor $Q_{20}$ and the terminal of the reference voltage $V_{ref}$, and the emitter resistors $R_5$ and $R_8$ are connected in parallel between the emitter of the transistor $Q_{20}$ and a common potential (for example, grounded) line.

The currents $I_1$ to $I_3$ flowing in the above-mentioned filter circuits are formed by transistors $Q_{22}$ to $Q_{24}$, respectively. The emitters of the transistors $Q_{22}$ to $Q_{24}$ are connected with emitter resistors $R_{10}$ to $R_{12}$, respectively. The bases of the transistors $Q_{22}$ to $Q_{24}$ are commonly connected and those transistors $Q_{22}$ to $Q_{24}$ are in a current mirror circuit connection together with the transistor $Q_{20}$. Thereby, the currents $I_1$ to $I_3$ flowing in the respective filter circuits are set by the current adjusting circuit CA. A field-effect transistor may be used in place of the bipolar transistor $Q_{20}$. In that case, the transistor $Q_{21}$ is not required.

In the above construction, the emitter of the transistor $Q_{20}$ is provided with the emitter resistors or trimming resistors $R_5$ to $R_8$ connected, for example, in parallel with each other for adjustably changing an emitter current flowing in the transistor $Q_{20}$, or in other words, for adjustably changing the currents $I_1$ to $I_3$ flowing in the above-mentioned filter circuits. The resistors $R_5$ to $R_8$ are not limited to the shown parallel connection form but may be provided with another connection form.

The parallel connection line of the trimming resistors $R_5$ to $R_8$ is selectively cut off by, for example, irradiation thereof with a laser beam. For example, a state in which all of the resistors $R_5$ to $R_8$ are connected in parallel with each other exhibits the smallest combined resistance, and the combined resistance value is made large by properly cutting off the connection line of the resistors $R_5$ to $R_7$. When the resistance value of the emitter resistance of the transistor $Q_{20}$ is thus made large, the voltage dividing ratio of the emitter resistance to the collector resistor $R_{90}$ is changed to increase a base potential $V_c$ of the transistor $Q_{20}$, thereby increasing the currents $I_1$ to $I_3$ in a constant ratio.

Resistors $R_{91}$ to $R_{93}$ may be connected with the collector resistor $R_{90}$ of the transistor $Q_{20}$ in a parallel form or another form. In this case, when the combined resistance value is made large by selectively cutting off a connection line of the resistors $R_{90}$ to $R_{93}$, the resistance ratio of the combined resistance on the collector side of the transistor $Q_{20}$ to the combined resistance on the emitter side thereof is changed to lower the base potential $V_c$ of the transistor $Q_{20}$, thereby decreasing the currents $I_1$ to $I_3$ in a constant ratio. Namely, it is possible not only to increase the potential $V_c$ but also to lower the same.

FIGS. 2A and 2B show one example of that structure of the collector load resistor means and/or emitter load resistor means of the transistor $Q_{20}$ shown in FIG. 1 which is suitable for a trimming operation. In FIG. 2A, the load resistor means includes a plurality of resistor elements $r_{11}$ to $r_{1n}$ (the resistance values of which may be the same or different) and two conductors $l_1$ and $l_2$ for making respective common connections of opposite ends of the resistor elements. For a trimming operation on the load resistor means, the conductor $l_2$ is cut off at one of a plurality of locations indicated by one-dotted chain lines by use of, for example, a laser beam. As a result, the resistance value of the load resistor means is adjusted. FIG. 2B is an electrical connection diagram of the resistor elements shown in FIG. 2A.

FIGS. 2C and 2D show an example of another structure of the load resistor means of the transistor $Q_{20}$. In FIG. 2C, the load resistor means includes a plurality of resistor elements $r_{21}$ to $r_{2n}$ (the resistance values of which may be the same or different), a conductor $l_3$ for commonly connecting one-side ends of the resistor elements $r_{21}$ to $r_{2n}$, conductors $l_4$, $l_5$ and $l_6$ for connecting the other-side ends of two adjacent resistor elements. A trimming operation on the load resistor means is achieved by cutting off the conductor $l_3$ at one or more of a plurality of locations indicated by one-dotted chain lines by use of, for example, a laser beam. FIG. 2D is an electrical connection diagram of the resistor elements shown in FIG. 2C.

The structure shown in FIG. 2A and the structure shown in FIG. 2C may be used in combination with each other.

As is apparent from the foregoing, various configurations using a plurality of resistor elements and a plurality of conductors can be considered as the structure of the load resistor means of the transistor $Q_{20}$ which is suitable for the resistor-trimming operation.

Figure 3B:
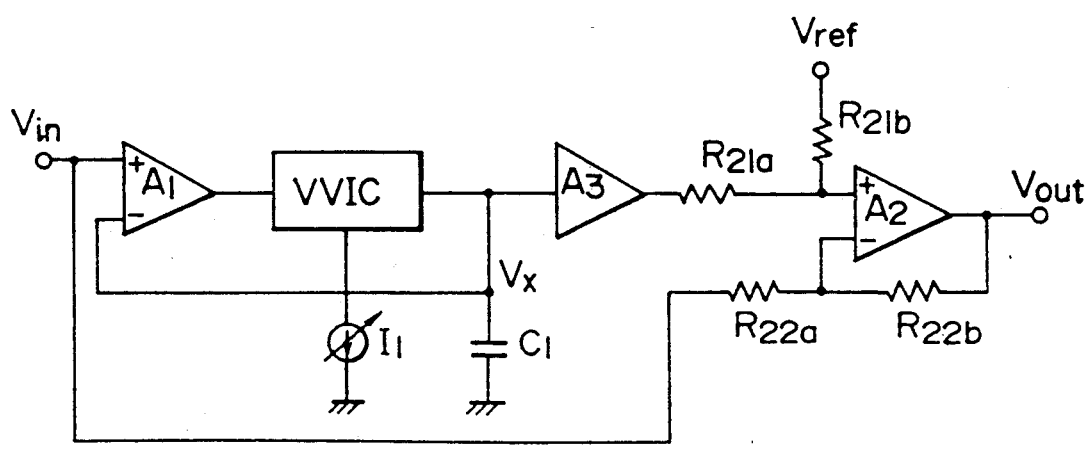

FIG. 3A shows a circuit diagram of a monolithic semiconductor integrated circuit device including a low-pass filter and high-pass filter circuit, and FIG. 3B shows a block diagram of the device shown in FIG. 3A.

Constant current sources $I_0$ are provided between the emitters of PNP type input transistors $Q_1$ and $Q_2$ and a power source voltage $C_{cc}$, respectively. The bases of the transistors $Q_1$ and $Q_2$ are connected with first and second input terminals, respectively. A resistance $R_1$ for obtaining an input signal current is provided between the emitters of the input transistors $Q_1$ and $Q_2$. The collectors of the transistors $Q_1$ and $Q_2$ are connected with diode-connected NPN transistors $Q_3$ and $Q_4$ which form active load circuits. The common emitter (or cathode) of the transistors $Q_3$ and $Q_4$ is coupled with a grounded potential point through a diode-connected NPN transistor $Q_5$. The above-mentioned circuit elements form a differential input stage $A_1$ or a first differentially operative circuit.

Output voltages formed by the diode-connected transistors $Q_3$ and $Q_4$ in which collector currents of the transistors $Q_1$ and $Q_2$ flow are supplied to the bases of differentially operative NPN transistors $Q_6$ and $Q_7$ which form a controllable voltage-current conversion circuit VVIC or a second differentially operative circuit.

The controllable voltage-current conversion circuit VVIC includes the differentially operative transistors $Q_6$ and $Q_7$, PNP transistors $Q_8$ and $Q_9$ which are provided in a current mirror circuit connection on the collector sides of the differentially operative transistors $Q_6$ and $Q_7$ and form active load circuits, and an adjustable current source circuit, as mentioned above, which includes a transistor $Q_{22}$ forming a second amplifying element causing the above-mentioned current $I_1$ to flow in the common emitter of the differentially operative transistors $Q_6$ and $Q_7$ and an emitter resistor $R_{10}$ of the transistor $Q_{22}$. The base of the transistor $Q_{22}$ is connected with the base of the transistor $Q_{20}$ of the current adjusting circuit CA so that a current mirror circuit connection is provided as a whole. A signal current formed by the differentially operative transistors $Q_6$ and $Q_7$ of the controllable voltage-current conversion circuit VVIC serves as a charging/ discharging current for a capacitor $C_1$ which will be explained later, and the current signal is fed back to the base of the transistor $Q_2$ which is a feedback terminal (or the second input terminal) of the above-mentioned differential input stage $A_1$. The capacitor $C_1$ forming a filter circuit is provided between the feedback terminal and an earth potential. The capacitor $C_1$ is incorporated in the semiconductor integrated circuit. For example, the capacitor $C_1$ is constructed by an inter-layer insulating film which has no voltage dependency and two electrodes which have the interlayer insulating film sandwiched therebetween. The other various methods of forming a capacitor in a semiconductor integrated circuit are known and any one thereof suitable for the filter circuit in the present embodiment can be used.

The differential input stage $A_1$ operates such that an input signal $V_{in}$ supplied to the base of the transistor $Q_1$ which is a non-inverted input ($+$) or first input terminal of the differential input stage and a DC potential of the base of the transistor $Q_2$ which is an inverted input ($-$) or second input terminal of the differential input stage become equal to each other. Since the capacitor $C_1$ is provided at the noninverted input ($-$) of the input stage $A_1$, the input signal $V_{in}$ is AC-wise attenuated in its high frequency region. Accordingly, a low-pass filter circuit can be constructed by providing a proper buffer circuit (or a high impedance element) at a junction point of the capacitor $C_1$ and the collectors of the transistors $Q_8$ and $Q_6$ so that the inverted input ($-$) signal is outputted through the buffer circuit.

In the present embodiment, the output of the low-pass filter circuit is inputted to a buffer circuit $A_3$. An output of the buffer circuit $A_3$ and the input signal $V_{in}$ are subtracted from each other by a subtracter circuit constructed by an operational amplifier circuit $A_2$ and resistors $R_{21a}$, $R_{21b}$, $R_{22a}$ and $R_{22b}$, thereby forming a high-pass filter output signal $V_{out}$.

Provided that the ON-resistance value of each of the transistors $Q_3$ and $Q_4$ is $r_{d1}$ and the resistance value of each of the emitter resistances of the transistors $Q_6$ and $Q_7$ is $r_{e1}$, there are satisfied a relation of $r_{d1} = (kT/q) \div I_0$ and a relation of $r_{e1} = (kT/q) \div I_1/2$. Here, kT/q is about 26 mV. Since the current $I_1$ can be changed by a resistor-trimming operation as mentioned above, it is possible to correspondingly change the resistance $r_{e1}$.

In the circuit shown in FIG. 3A, when the input signal $V_{in}$ is inputted, a current of $(V_{in}-V_x)/R_1$ is outputted from the collector of the transistor $Q_1$ and a phase-inverted current thereof is outputted from the collector of the transistor $Q_2$. $V_x$ is a voltage on a junction point of the capacitor $C_1$ and the base of the transistor $Q_2$. The diode-connected transistors $Q_3$ and $Q_4$ serve as loads so that signal voltages outputted from the collectors of the transistors $Q_3$ and $Q_4$ result in $r_{d1} \cdot (V_{in}-V_x)/R_1$. These signal input voltages supplied to the bases of the differentially operative transistors $Q_6$ and $Q_7$ which form the controllable voltage-current conversion circuit VVIC.

Since the emitter resistance of each of the differentially operative transistors $Q_6$ and $Q_7$ is $r_{e1}$, as mentioned above, the following current is obtained from the collectors of the transistors $Q_6$ and $Q_7$. Namely, in the controllable voltage-current conversion circuit VVIC, a signal current is formed in such a manner that the above-mentioned signal voltages $r_{d1} \cdot (V_{in}-V_x)/R_1$ are applied to the emitter resistances $r_{e1}$ of the differentially operative transistors $Q_6$ and $Q_7$. Accordingly, the signal current formed is $[r_{d1} \cdot (V_{in}-V_x)/R_1] \div r_{e1}$. This current is supplied to the capacitor $C_1$. The capacitor $C_1$ serves to attenuate a high frequency component of the supplied current signal. Therefore, there is obtained the following signal voltage $V_x$:

$$V_x = [(V_{in}-V_x)/R_1] \times (r_{d1}/j\omega C_1) \quad (1)$$

On the other hand, in the subtracter circuit $A_2$, a relation of $$V_{in}-V_x/2 + V_{out}-V_x/2 = 0 \quad (2)$$

is satisfied (on the assumption that $R_{21a} = R_{21b}$ and $R_{22a} = R_{22b}$)

The equations (1) and (2) provide the following input/output transfer function:

$$V_{out}/V_{in} = [j\omega C_1 \cdot R_1 (r_{e1}/r_{d1})] \div [1 + j\omega C_1 \cdot R_1 (r_{e1}/r_{d1})]. \quad (3)$$

The equation (3) shows a high-pass filter and a cut-off frequency $f_H$ of the filter is represented by $$f_H = \frac{1}{(2\pi C_1 \cdot R_1)(r_{e1}/r_{d1})}.$$

By setting $r_{e1}$ and $r_{d1}$ so as to satisfy a relation of $(r_{e1}/r_{d1}) > 1$ for the time constant defined by $C_1 \cdot R_1 (r_{e1}/r_{d1})$, the capacitance value of the capacitor $C_1$ is equivalently made large. Thereby, it is possible to obtain a filter circuit having a relatively large time constant or a relatively low cut-off frequency even if a capacitor incorporated in a semiconductor integrated circuit has a relatively small capacitance. Also, the resistance value of the resistor $r_{e1}$ can be corrected by adjusting the current $I_1$ through the resistor-trimming operation in the current adjusting circuit CA. Thereby, it is possible to compensate for variations of cut-off frequencies $f_H$ from one semiconductor integrated circuit chip to another which may be caused by the deviations of electric characteristics of circuit elements in a semiconductor integrated circuit.

Figure 4A:
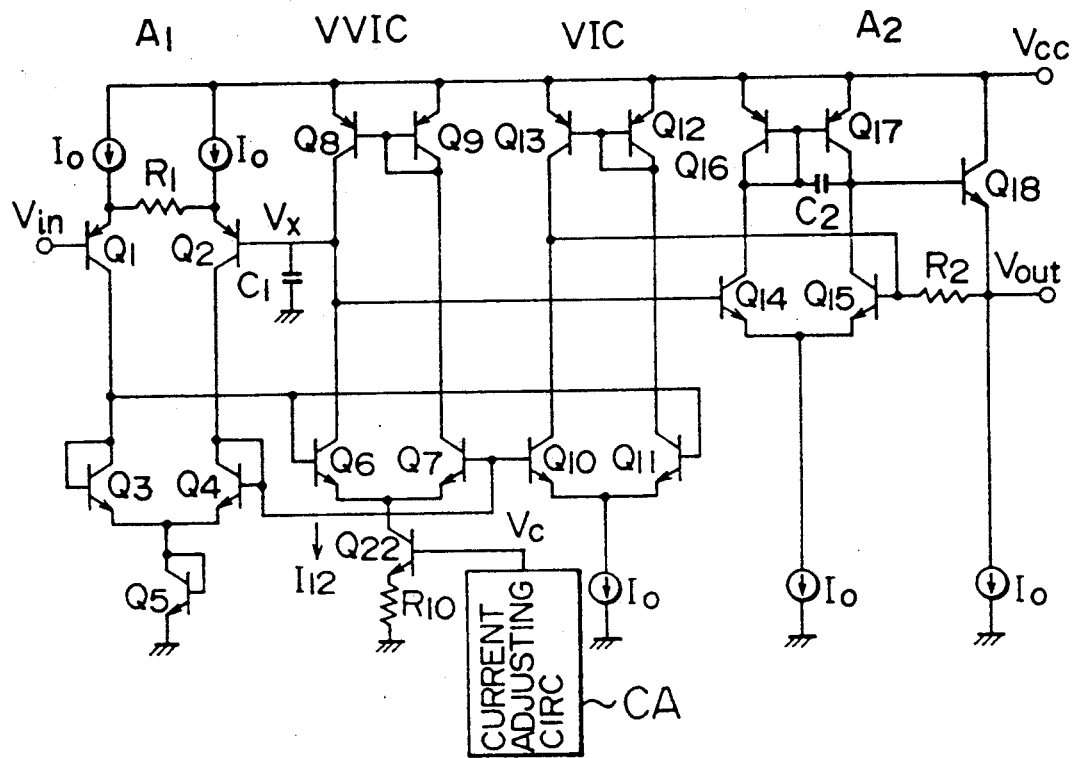
FIGS. 4A and 4B are a circuit diagram and a block diagram of a monolithic semiconductor integrated circuit device including another filter circuit according to another embodiment of the present invention.
Figure 4B:
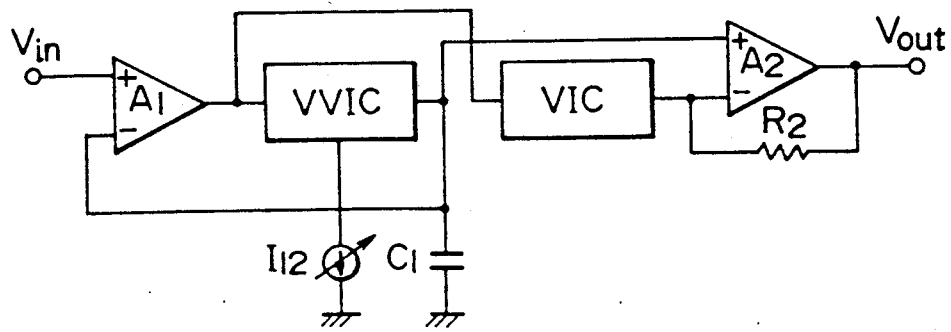

FIG. 4A shows a circuit diagram of a monolithic semiconductor integrated circuit device including another filter circuit, and FIG. 4B shows a block diagram of the device shown in FIG. 4A.

An input signal $V_{in}$ and a feedback signal $V_x$ are supplied to a differential input stage $A_1$ (or a first differentially operative circuit) similar to that in the device shown in FIG. 3A.

Output voltages of the differential input stage $A_1$ formed by diode-connected transistors $Q_3$ and $Q_4$ in which collector currents of the differentially operative transistors $Q_1$ and $Q_2$ flow are applied to the bases of differentially operative NPN transistors $Q_6$ and $Q_7$ which form a controllable voltage-current conversion circuit VVIC (or a second differentially operative circuit) and the bases of differentially operative NPN transistors $Q_{10}$ and $Q_{11}$ which form a voltage-current conversion circuit VIC (or a third differentially operative circuit).

Like the embodiment shown in FIGS. 3A and 3B, the controllable voltage-current conversion circuit VVIC (or the second differentially operative circuit) includes the differentially operative transistors $Q_6$ and $Q_7$, PNP transistors $Q_8$ and $Q_9$ which are provided in a current mirror circuit connection on the collector sides of the differentially operative transistors $Q_6$ and $Q_7$ and form active load circuits, and a transistor $Q_{22}$ and an emitter resistor $R_{10}$ thereof which are provided on the common emitter side of the differentially operative transistors $Q_6$ and $Q_7$ and form an adjustable current source circuit $I_{12}$. The transistor $Q_{22}$ and a current adjusting circuit CA are in a current mirror circuit connection, like the embodiment shown in FIG. 3A. A signal current (or a first current signal) formed by the differentially operative transistors $Q_6$ and $Q_7$ of the controllable voltage-current conversion circuit VVIC serves as a charging/discharging current for a capacitor $C_1$ and the current signal is fed back to the base of the transistor $Q_2$ which is a feedback terminal of the differential input stage $A_1$.

The voltage-current conversion circuit VIC (or the third differentially operative circuit) receiving the output signal of the differential input stage $A_1$ to convert it into a second current signal includes the differentially operative transistors $Q_{10}$ and $Q_{11}$, PNP transistors $Q_{12}$ and $Q_{13}$ which are provided in a current mirror circuit connection on the collector sides of the differentially operative transistors $Q_{10}$ and $Q_{11}$ and form active load circuits, and a constant current source $I_0$ which is provided to the common emitter of the differentially operative transistors $Q_{10}$ and $Q_{11}$.

An output signal of the controllable voltage-current conversion circuit VVIC and an output signal of the voltage-current conversion circuit VIC are supplied to a non-inverted input (+) and an inverted input (−) of an operational amplifier circuit $A_2$ which forms an adder circuit. The operational amplifier circuit $A_2$ includes a differentially operative circuit and an output circuit. The differentially operative circuit is composed of differentially operative NPN transistors $Q_{14}$ and $Q_{15}$ which receive the output signals of the voltage-current conversion circuits VVIC and VIC, PNP transistors $Q_{16}$ and $Q_{17}$ which are provided in a current mirror circuit connection on the collector sides of the differentially operative transistors $Q_{14}$ and $Q_{15}$ and serve as active loads, a capacitor $C_2$ for phase compensation which is provided between the base and collector of the transistor $Q_{17}$ on the output side, and a constant current source $I_0$ which is provided to the common emitter of the differentially operative transistors $Q_{14}$ and $Q_{15}$. The output circuit of the operational amplifier circuit $A_2$ is composed of an emitter-follower output transistor $Q_{18}$ and a constant current source $I_0$ provided to the emitter of the transistor $Q_{18}$.

The base of the transistor $Q_{14}$ which is the non-inverted input (+) of the operational amplifier circuit $A_2$ is connected with the commonly connected collectors of the transistors $Q_6$ and $Q_8$ which are an output terminal of the controllable voltage-current conversion circuit VVIC. The base of the transistor $Q_{15}$ which is the inverted input (−) of the operational amplifier circuit $A_2$ is connected with the commonly connected collectors of the transistors $Q_{10}$ and $Q_{13}$ which are an output terminal of the voltage-current conversion circuit VIC.

In order to allow the operational amplifier circuit $A_2$ to operate as an adder circuit, a feedback resistor $R_2$ is provided between an output terminal and the inverted input (−) of the operational amplifier circuit $A_2$. Namely, the resistor $R_2$ is inserted between the emitter of the output transistor $Q_{18}$ and the base of the differential transistor $Q_{15}$.

Explanation will now be made of the operation of the filter circuit of the present embodiment.

The differential input stage $A_1$ operates such that an input signal $V_{in}$ supplied to the base of the transistor $Q_1$ which is a non-inverted input (+) or first input terminal of the differential input stage $A_1$ and a DC potential of the base of the transistor $Q_2$ which is an inverted input (−) or second input terminal of the differential input stage $A_1$ become equal to each other. Since the capacitor $C_1$ is provided at the inverted input (−) of the input stage $A_1$, the input signal $V_{in}$ is AC-wise attenuated in its high frequency region. Accordingly, like the embodiment shown in FIG. 3A, a low-pass filter output is obtained from the inverted input (−) or the base of the transistor $Q_2$ with which the capacitor $C_1$ is connected.

When the input signal $V_{in}$ is inputted, a current of $(V_{in}-V_x)/R_1$ is outputted from the collector of the transistor $Q_1$ and a phase-inverted current thereof is outputted from the collector of the transistor $Q_2$. The diode-connected transistors $Q_3$ and $Q_4$ serve as loads so that signal voltages outputted from the collectors of the transistors $Q_3$ and $Q_4$ result in $r_{d1}\cdot(V_{in}-V_x)/R_1$, provided that the ON-resistance of each of the transistors $Q_3$ and $Q_4$ both in a diode connection is $r_{d1}$. These signal voltages (or first and second output voltages) serve for input voltages of the differentially operative transistors which form the controllable voltage-current conversion circuit VVIC and the voltage-current conversion circuit VIC.

Provided that the resistance value of the emitter resistance of each of the differentially operative transistors $Q_6$ and $Q_7$ is $r_{e1}$, the following current is obtained from the collectors of the transistors $Q_6$ and $Q_7$.

In the controllable voltage-current conversion circuit VVIC, since a signal current is formed in such a manner that the above-mentioned signal voltages $r_{d1}\cdot(V_{in}-V_x)/R_1$ are applied to the emitter resistances $r_{e1}$ of the differentially operative transistors $Q_6$ and $Q_7$, the signal current formed is $[r_{d1}\cdot(V_{in}-V_x)R_1]\div r_{e1}$. This current is supplied to the capacitor $C_1$. Since the capacitor $C_1$ serves to attenuate a high frequency component of the supplied current signal, the signal $V_x$ has a low-pass filter output characteristic. Thus, the signal fed back to the differential input stage $A_1$ has a low-pass filter characteristic. Accordingly, an output signal of the differential input stage $A_1$ has a high-pass filter characteristic in accordance with the decrease of feedback amount of the high frequency component.

In the present embodiment, the output signal of the differential input stage $A_1$ is converted into a current signal of $[r_{d1}\cdot(V_{in}-V_x)/R_1]\div r_{e2}$ by the differentially operative transistors $Q_{10}$ and $Q_{11}$ of the voltage-current conversion circuit VIC and the current signal flows through the feedback resistor $R_2$ of the adder circuit $A_2$. Here, 's the resistance value of the emitter resistance of each of the transistors $Q_{10}$ and $Q_{11}$. From the above explanation of the operation, there are satisfied the following equations (4) and (5):

$$V_x = (V_{in} - V_x)/R_1] \times r_{d1}/(r_{e1} \times j\omega C_1) \tag{4}$$

$$V_{out} = (V_{in} - V_x)/R_1] \times (r_{d1}/r_{e2}) \times R_2 + V_x. \tag{5}$$

The equations (4) and (5) provide the following input-/output transfer function:

$$V_{out}/V_{in} = [1 + j\omega C_1 (r_{e2}/r_{d1}) \times R_2] \div [1 + j\omega C_1 (r_{e1}/r_{d1}) \times R_1]. \tag{6}$$

From the equation (6), it is apparent that there serves for not only a low-pass filter but also a high-pass filter, depending on the resistance values of the resistors $R_1$ and $R_2$.

Figure 4C:
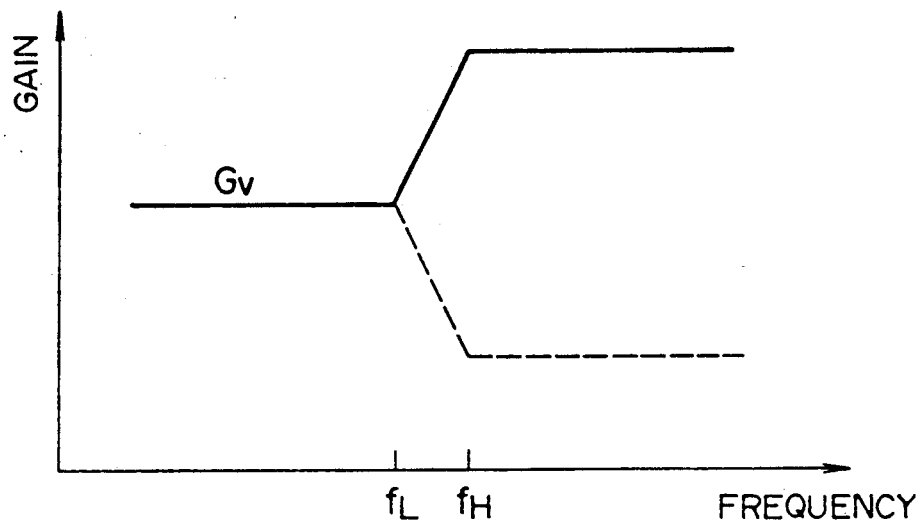
FIG. 4C shows a gain versus frequency characteristic useful for explaining the operation of the device shown in FIGS. 4A and 4B.

In the case of $R_1 r_{e1} < R_2 r_{e2}$, there is provided a high-pass filter the lower cut-off frequency $f_L$ of which is $C_1 \cdot R_2(r_{e1}/r_{e2})$ and the higher cut-off frequency $f_H$ of which is $C_1 \cdot R_1(r_{e1}/r_{e2})$, as shown by solid line in FIG. 4C. On the contrary, in the case of $R_1 r_{e1} > R_2 r_{e2}$, there is provided a low-pass filter the lower cut-off frequency $f_L$ of which is $C_1 \cdot R_1(r_{e1}/r_{e2})$ and the higher cut-off frequency $f_H$ of which is $C_1 \cdot R_2(r_{e1}/r_{e2})$, as shown by dotted line in FIG. 4C. As a matter of design, $r_{e1}$ and $r_{e2}$ are made approximately equal to each other and hence the filter characteristic is determined in accordance with a relation in magnitude between $R_1$ and $R_2$.

Compensation for a variation of a time constant defined by $CR(r_{e1}/r_{e2})$ can be made through such a resistor-trimming operation as explained in conjunction with FIG. 2A or 2B since the resistance $r_{e1}$ is changed by a constant current source $I_{12}$. Also, by setting $r_{e1}$ and $r_{e2}$ so as to satisfy a relation of $(r_{e1}/r_{e2}) > 1$, the time constant can be regarded as being equivalent to one in which the capacitance value of the capacitor $C_1$ is made large. Thereby, it is possible to obtain a relatively large time constant even if a capacitor incorporated in a semiconductor integrated circuit has a relatively small capacitance.

Figure 5A:
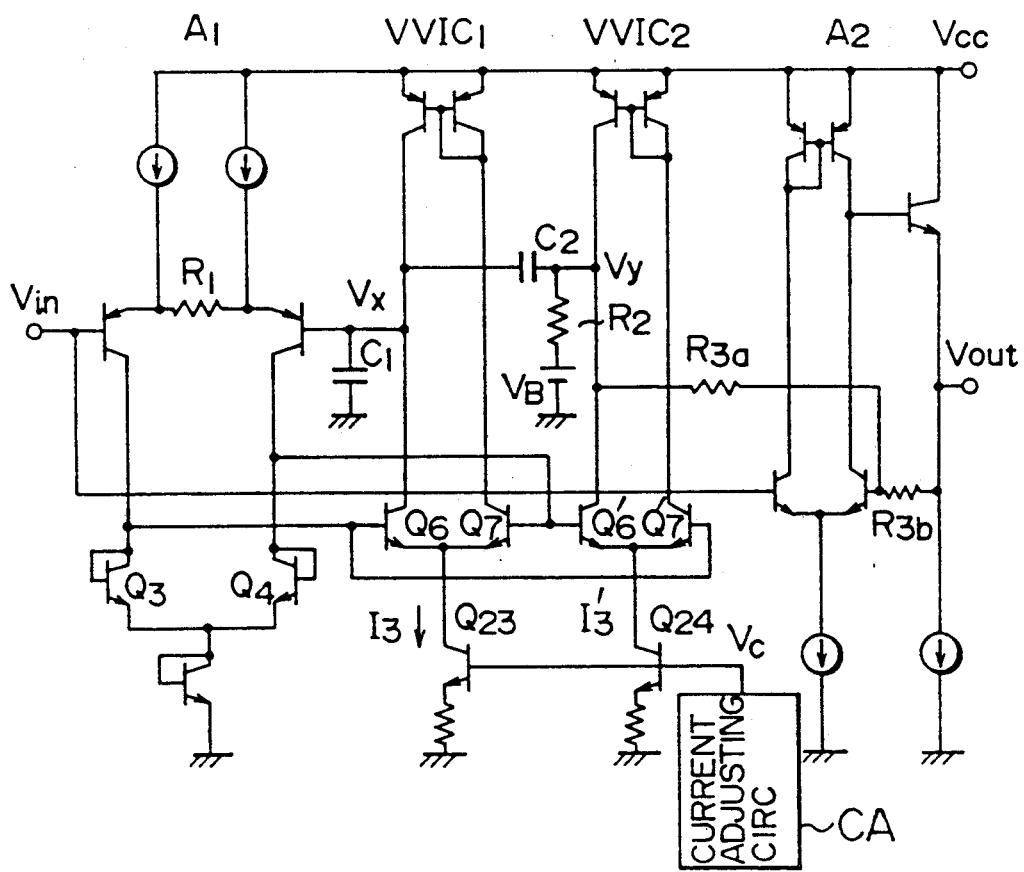
FIGS. 5A and 5B are a circuit diagram and a block diagram of a monolithic semiconductor integrated circuit device including a further filter circuit according to a further embodiment of the present invention.
Figure 5B:
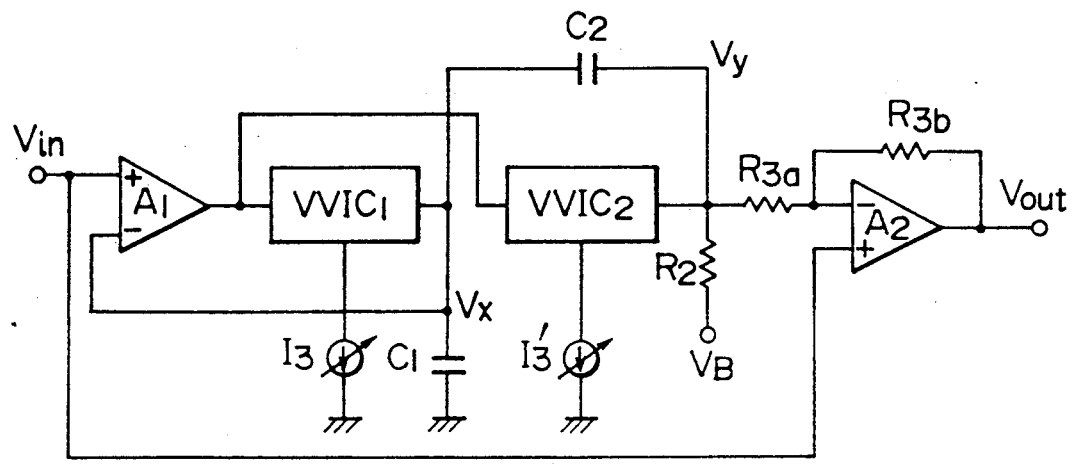

FIG. 5A shows a circuit diagram of a monolithic semiconductor integrated circuit device including a notch filter circuit, and FIG. 5B shows a block diagram of the device shown in FIG. 5A.

A differential input stage $A_1$, a first controllable voltage-current conversion circuit $VVIC_1$ and an operational amplifier $A_2$ shown in FIG. 5A have constructions similar to those of the circuits shown in FIG. 4A. A second controllable voltage-current conversion circuit $VVIC_2$ may have a construction similar to that of the first controllable voltage-current conversion circuit $VVIC_1$.

In the embodiment shown in FIGS. 5A and 5B, output signals of the differential input stage $A_1$ are supplied to the first and second controllable voltage-current conversion circuits $VVIC_1$ and $VVIC_2$ in order to obtain a notch filter characteristic. Second amplifying elements or transistors $Q_{23}$ and $Q_{24}$ in the first and second controllable voltage-current conversion circuits $VVIC_1$ and $VVIC_2$ are in a current mirror circuit connection together with a current adjusting circuit CA, like the embodiment shown in FIG. 3A. Accordingly, the transistors $Q_{23}$ and $Q_{24}$ form adjustable current sources $I_3$ and $I_3'$. A load resistor $R_2$ is provided between an output terminal of the second controllable voltage-current conversion circuit $VVIC_2$ and a predetermined bias terminal $V_B$. A capacitor $C_2$ is provided between the outputs of the first and second controllable voltage-current conversion circuits $VVIC_1$ and $VVIC_2$. An output signal $V_y$ of the second controllable voltage-current conversion circuit $VVIC_2$ and an input signal $V_{in}$ are summed by an adder circuit which is constructed by the operational amplifier circuit $A_2$. Namely, the input signal $V_{in}$ is supplied to a non-inverted input terminal (+) of the operational amplifier circuit $A_2$ while the signal $V_y$ is supplied to an inverted input terminal (−) thereof through a resistor $R_{3a}$, and a resistor $R_{3b}$ is provided between the inverted input (−) and an output of the operational amplifier circuit $A_2$.

Provided that the ON-resistance of each of the transistors $Q_3$ and $Q_4$ of the differential input stage $A_1$, the emitter resistance of each of differentially operative transistors $Q_6$ and $Q_7$ of the first controllable voltage-current conversion circuit $VVIC_1$ is $r_{e1}$ and the emitter resistance of each of differentially operative transistors $Q_6'$ and $Q_7'$ of the second controllable voltage-current conversion circuit $VVIC_2$ is $r_{e3}$, the following equations (7) and (9) are satisfied similarly to the above explained:

$$[(V_{in}-V_x)/R_1] \times 2r_{d1}/r_{e1} - j\omega C_1 C_x + j\omega C_2(V_y-V_x) = 0 \tag{7}$$

$$[(V_{in}-V_x)/R_1] \times 2r_{d1}/r_{e3} + (V_y/R_2) + j\omega C_2(V_y-V_x) = 0 \tag{8}$$

$$V_{out} = V_{in} + V_y \text{ (under assumption of } R_{3a} = R_{3b}). \tag{9}$$

The notch frequency as represented by the corresponding angular frequency $\omega_0$ and the gain $G_{v\omega_0}$ of the notch filter circuit at the notch angular frequencies will be determined from equations (7) to (9) as follows.

$$\omega_0 = 1 / \sqrt{\frac{r_{e1}}{2r_{d1}} \cdot R_1 \cdot R_2 \cdot C_1 \cdot C_2}$$

$$G_{v\omega_0} = \left( \frac{C_1 + C_2}{R_2} + \frac{1}{R_1} \cdot \frac{2r_{d1}}{r_{e1}} \cdot C_2 - \frac{1}{R_1} \cdot \frac{2r_{d1}}{r_{e3}} - \frac{C_1 + C_2}{R_1} \cdot \frac{2r_{d1}}{r_{e3}} \right) / \left( \frac{C_1 + C_2}{R_2} - \frac{1}{R_1} \cdot \frac{2r_{d1}}{r_{e3}} \cdot C_2 \right)$$

From the above two equations, it can be seen that the notch frequency can be controlled by the control current $I_3$, i.e., by the resistance $r_{e1}$ in the first controllable voltage-current conversion circuit $VVIC_1$, while the gain at the notch frequency can be adjusted by the control current $I_3'$, i.e., by the resistance $r_{e3}$ in the second controllable voltage-current conversion circuit $VVIC_2$ with the control current $I_3$ being first fixed, though the gain could be varied by the control current $I_3$ (the resistance $r_{e1}$).

Figure 6A:
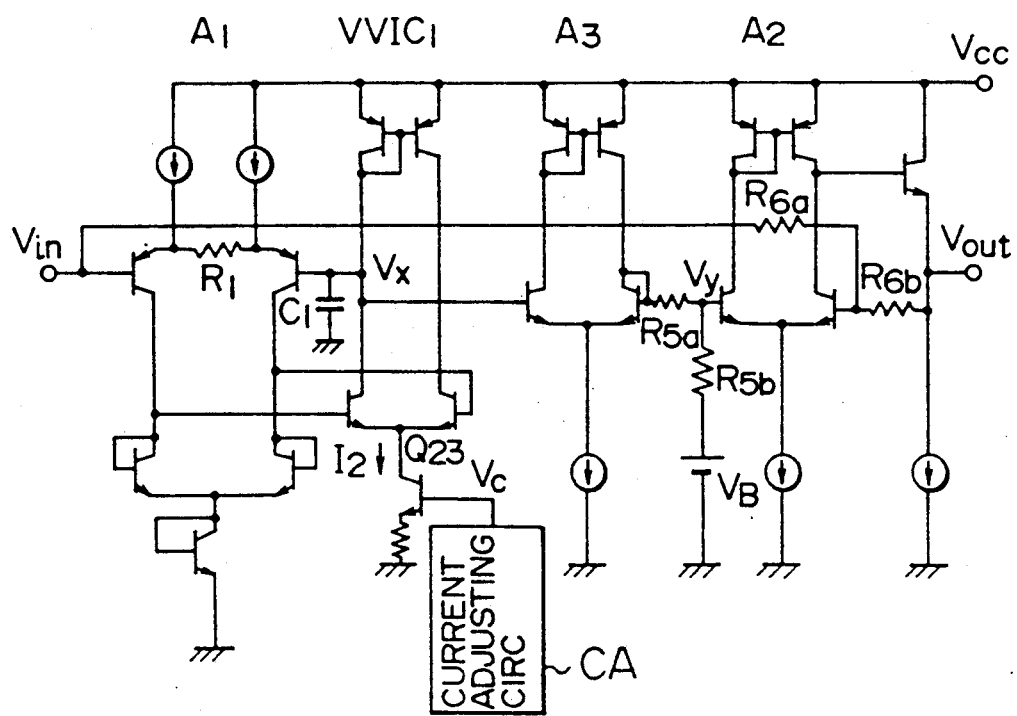
FIGS. 6A and 6B are a circuit diagram and a block diagram of a monolithic semiconductor integrated circuit device including a still further filter circuit according to a still further embodiment of the present invention.
Figure 6B:
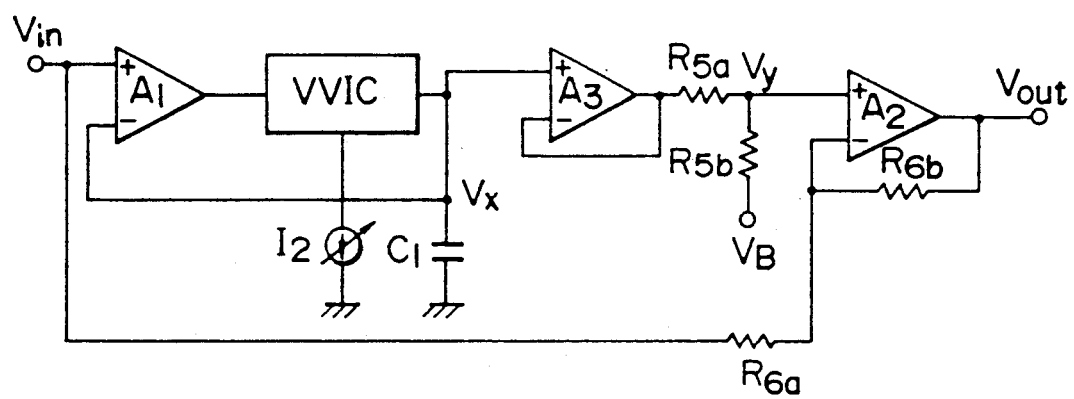

FIG. 6A shows a circuit diagram of a monolithic semiconductor integrated circuit device including a high-pass filter circuit, and FIG. 6B shows a block diagram of the device shown in FIG. 6A.

A differential input stage $A_1$, a controllable voltage-current conversion circuit VVIC, an operational amplifier circuit $A_3$ and an adder circuit $A_2$ shown in FIG. 6A may have constructions similar to those of the circuits shown in FIG. 3A. A second amplifying element or transistor $Q_{23}$ in the controllable voltage-current conversion circuit VVIC is in a current mirror circuit connection together with a current adjusting circuit CA, like the embodiment shown in FIG. 3A. Accordingly, the transistor $Q_{23}$ forms an adjustable current source $I_2$.

However, in the embodiment shown in FIG. 6A, a feedback is applied to the operational amplifier circuit $A_3$ in order to reduce the DC offset and the signal distortion of an output $V_{out}$. Namely, a signal $V_x$ in the controllable voltage-current conversion circuit VVIC having a low-pass filter characteristic is divided by resistors $R_{5a}$ and $R_{5b}$ through the operational amplifier $A_3$ in a voltage-follower configuration and is thereafter supplied to a non-inverted input (+) of the operational amplifier circuit $A_2$. An inverted input (−) of the operational amplifier circuit $A_2$ is applied with an input signal $V_{in}$ through a resistor $R_{5a}$ and a resistor $R_{5b}$ is provided between the inverted input (−) and an output of the operational amplifier circuit $A_2$.

Briefly explaining the operation of the filter circuit of the embodiment shown in FIG. 6A, a high-pass filter characteristic is obtained subtracting the signal $V_x$ having the low-pass filter characteristic from the input signal $V_{in}$. This can be quantitatively explained by equations (10) to (12) which will be shown just in below. Namely, since a relation of $V_x=[(V_{in}-V_x)/R_1]\times(r_{d1}/r_{e1})\times 1/j\omega C_1$ is satisfied similarly to the above explained, there are satisfied the following equations (10) to (12):

$$V_x/V_{in} = \frac{1}{(1 + j\omega C_1 \cdot R_1 \cdot r_{e1}/r_{d1})} \quad (10)$$

$$V_y = V_x/2 \quad (11)$$

$$V_{in}\text{-}V_y + V_{out}\text{-}V_y = 0. \quad (12)$$

From the equations (10) to (12), a transfer function as shown by the equation (3) is obtained similarly to the case of the circuit shown in FIG. 3A (on the assumption that $R_{5a}=R_{5b}$ and $R_{6a}=R_{6b}$).

In the embodiment shown in FIGS. 6A and 6B, since the feedback is applied also to the amplifier circuit $A_3$ to obtain the output signal $V_{out}$, it is possible to greatly reduce the DC offset voltage and the signal distortion. Also, a gain can be adjusted by setting the ratio of the resistance value of the resistor $R_{5a}$ to that of the resistor $R_{5b}$ and the ratio of the resistance value of the resistor $T_{6a}$ to that of the resistor $R_{6b}$ to desired values.

Functional effects obtained by the above-mentioned embodiments are as follows:

(1) Since the electric characteristics of circuit elements formed in a semiconductor integrated circuit have approximately uniform deviations in only one direction, it is possible to match the time constants of filter circuits with each other through a resistor-trimming operation at one location.

(2) By transmitting an output signal of a differential input stage to a controllable voltage-current conversion circuit and providing a capacitor charged/discharged by an output signal of the controllable voltage-current conversion circuit so that the output signal is fed back to a feedback terminal of the differential input stage, a signal having a low-pass filter characteristic and a signal having a high-pass filter characteristic can be obtained from the feedback terminal and an output terminal, respectively. A variety of filter circuits can be constructed by a signal processing of those signals including summation, subtraction and/or so on. A frequency response can be corrected by flowing a control current in the controllable voltage-current conversion circuit.

(3) The capacitance value of the capacitor provided to the feedback terminal of the differential input stage can be made equivalently large in accordance with the ratio of a load resistor of the differential input stage to the emitter resistance of transistors forming the voltage-current conversion circuit. Thereby, even in a semiconductor integrated circuit in which only a capacitor having a relatively small capacitance can be formed, a filter circuit having a relatively low cut-off frequency can be obtained.

In the foregoing, the invention made by the present inventors has been specifically explained on the basis of the embodiments thereof. However, of course, the present invention is not limited to the disclosed embodiments but various changes or modifications can be made without departing from the subject matter of the present invention. For example, a structure for changing a control current by a resistor-trimming operation can employ a variety of configurations inclusive of the trimming of patterns of resistor elements themselves instead of the disclosed selective cutting-off of the connection lines by which resistor elements are connected. Also, differentially operative amplifying elements forming a filter circuit may include MOSFETs (insulated-gate field-effect transistors), junction type FETs instead of bipolar transistors disclosed. Further, a specific construction for an adder or subtracter circuit for receiving the signal having the low-pass filter characteristic and the signal having the high-pass filter characteristic can employ a variety of configurations.

The present invention is widely applicable to a semiconductor integrated circuit device having a filter circuit incorporated therein.

We claim:

1. A monolithic semiconductor integrated circuit device, comprising:

a current adjusting circuit including at least one first amplifying element and first and second load resistor means for said amplifying element, said first amplifying element having a control electrode, a current receiving electrode connected with said first load resistor means and a current delivering electrode connection with said second load resistor means, at least one of said first and second load resistor means being means for trimming resistance to adjustably determine the resistance of said at least one of said first and second load resistor means for controlling the current flowing between said current receiving electrode and said current delivering electrode; and an audio signal processing circuit including a differentially operative circuit section and a second amplifying element, said second amplifying element having a control electrode, a current receiving electrode and a current delivering electrode, one of said current receiving and delivering electrodes being connected with said differentially operative circuit section, said differentially operative circuit section having a frequency response depending on an electric current flowing in a current path between said current receiving and delivering electrodes of said second amplifying element, said first and second amplifying elements being in a current mirror circuit connection with their control electrodes being connected with each o.her so that said electric current flowing in the current path between said current receiving and delivering electrodes of said second amplifying element is controlled by said adjustably determined resistance of said at least one load resistor means to adjust the frequency response of said audio signal processing circuit, thereby compensating for variations of electric characteristics of the audio signal processing circuit.

2. A device according to claim 1, wherein the other of said first and second load resistor means is means for trimming resistance to adjustably determine the resistance of said other of said first and second load resistor means for controlling the current flowing between said current receiving electrode and said current delivering electrode.

3. A device according to claim 2, in which each of said first and second load resistor means includes a plurality of resistor elements arranged with connectors therebetween that may be cut during the trimming.

4. A device according to claim 1, in which said first and second amplifying elements are first and second bipolar transistors, and a third bipolar transistor is connected with said first bipolar transistor such that the base and emitter of said third bipolar transistor are connected with the collector and base of said first bipolar transistor, respectively.

5. A device according to claim 1, in which each of said first and second amplifying elements is a field-effect transistor.

6. A filter according to claim 2, wherein the other of said first and second load resistor means is means for trimming resistance to adjustably determine the resistance of said other of said first and second load resistor means for controlling the current flowing between said current receiving electrode and said current delivering electrode.

7. A filter according to claim 6, in which each of said first and second load resistor means includes a plurality of resistor elements arranged with connectors therebetween that may be cut curing the trimming.

8. A device according to claim 1, wherein the audio signal processing circuit has a time constant defined by a capacitance times a resistance times a value proportional to the adjustably determined resistance of said at least one load resistor means that directly determines the frequency response.

9. A device according to claim 8, wherein said means for trimming increases the time constant.

10. A filter in an integrated circuit form, comprising:
a current adjusting circuit including at least one first amplifying element and first and second load resistor means for said amplifying element, said first amplifying element having a control electrode, a current receiving electrode connected with said first load resistor means and a current delivering electrode connected with said second load resistor means, at least one of said first and second load resistor means being means for resistance to adjustably determine the resistance of said at least one of said first and second load resistor means for controlling the current flowing between said current receiving electrode and said current delivering electrode;
a first differentially operative circuit serving as an input stage and having a first input terminal for receiving an input signal to the filter and a second input terminal;
a capacitor connected with said second input terminal;
a second differentially operative circuit serving to convert an output voltage of said first differentially operative circuit to a corresponding current signal, said capacitor being also connected with said second differentially operative circuit to receive said current signal for a charge/discharge operation therewith, said second differentially operative circuit including a pair of differential amplifier elements and a second amplifying element, said second amplifying element having a control electrode, a current receiving electrode and a current delivering electrode, one of said current receiving and delivering electrodes being connected with said pair of differential amplifier elements, said second differentially operative circuit having a frequency response depending on an electric current receiving and delivering electrodes of said second amplifying element, said first and second amplifying elements being in a current mirror circuit connection with their control electrodes being connected with each other so that said electric current flowing in the current path between said current receiving and delivering electrodes of said second amplifying element is controlled by said adjustably determined resistance of said at least one load resistor means; and
an adder circuit for summing an output signal representative of a terminal voltage of said capacitor and said input signal.

11. A filter according to claim 10, wherein the other of said first and second load resistor means is means for trimming resistance to adjustably determine the resistance of said other of said first and second load resistor means for controlling the current flowing between said current receiving electrode and said current delivering electrode.

12. A filter according to claim 11, in which each of said first and second load resistor means includes a plurality of resistor elements arranged with connectors therebetween that may be cut curing the trimming.

13. A filter according to claim 10, wherein said second differentially operative circuit has a time constant defined by a capacitances times a resistance times a value proportional to the adjustably determined resistance times a value proportional to the adjustably determined resistance of said at least one load resistor means that directly determine the frequency response.

14. A device according to claim 13, wherein said means for trimming increases the time constant.

15. A filter according to claim 10, wherein said first differentially operative circuit, said capacitor and said second differentially operative circuit constitute one of a low-pass filter, high-pass filter and notch filter, and further comprising another of the low-pass filter, high-pass filter and notch filter including another first differentially operative circuit, another capacitor and another second differentially operative circuit, substantially identical to the first mentioned first differentially operative circuit, capacitor and second differentially operative circuit all connected so that the frequency response of at least two separate filters is commonly adjusted by a single means for trimming.

16. A filter according to claim 15, wherein the other of said first and second load resistor means is means for trimming resistance to adjustably determine the resistanc of said other of said first and second load resistor means for controlling the current flowing between said current receiving electrode and said current delivering electrode.

17. A filter according to claim 16, wherein each of said first and second load resistor means includes a plurality of resistor elements arranged with connectors therebetween that may be cut curing the trimming.

18. A filter according to claim 15, wherein said second differentially operative circuit has a time constant defined by a capacitance times a resistance times a value proportional to the adjustably determined resistance of said at least one load resistor means that directly determine the frequency response.

19. A device according to claim 18, wherein said means for trimming increases the time constant.

20. A filter according to claim 15, wherein the other of said first and second load resistor means is means for trimming resistance to adjustably determine the resistance of said other of said first and second load resistor means for controlling the current flowing between said current receiving electrode and said current delivering electrode.

21. A filter according to claim 20, wherein each of said first and second load resistor means includes a plurality of resistor elements arranged with connectors therebetween that may be cut curing the trimming.

22. A filter in an integrated circuit form comprising:
a current adjusting circuit including at least one first amplifying element and first and second load resistor means for said amplifying element, said first amplifying element having a control electrode, a current receiving electrode connected with said first load resistor means and a current delivering electrode connected with said second load resistor means, at least one of said first and second load resistor means being means for trimming resistance to adjustably determine the resistance of said at least one of said first and second load resistor means for controlling the current flowing between said current receiving electrode and said current delivering electrode;
a first differentially operative circuit serving as an input stage and having a first input terminal for receiving an input signal to the filter and a second input terminal;
a capacitor connected with said second input terminal;
a second differentially operative circuit serving to convert an output voltage of said first differentially operative circuit to a corresponding current signal, said capacitor being also connected with said second differentially operative circuit to receive said current signal for a charge/discharge operation therewith, said second differentially operative circuit including a pair of differential amplifier elements and a second amplifying element, said second amplifying element having a control electrode, a current receiving electrode and a current delivering electrode, one of said current receiving and delivering electrodes being connected with said pair of differential amplifier elements, said second differentially operative circuit having a frequency response depending on an electric current flowing in a current path between said current receiving and delivering electrodes of said second amplifying element, said first and second amplifying elements being in a current mirror circuit connection with their control electrodes being connected with each other so that said electric current flowing in the current path between said current receiving and delivering electrodes of said second amplifying element is controlled by said adjustably determined resistance of said at least one load resistor means; and
a third differentially operative circuit serving to convert a second output voltage of said first differentially operative circuit to a corresponding second current signal; and
an adder circuit for summing an output signal of said second differentially operative circuit representative of a terminal voltage of said capacitor and an output signal of said third differentially operative circuit representative of said second current signal.

23. A device according to claim 22, wherein said second differentially operative circuit has a time constant defined by a capacitances times a resistance times a value proportional to the adjustably determined resistance of said at least one load resistor means that directly determine the frequency response.

24. A filter according to claim 23, wherein said means for trimming increases the time constant.

25. A filter according to claim 22, wherein said first differentially operative circuit, said capacitor and said second differentially operative circuit constitute one of a low-pass filter, high-pass filter and notch filter, and further comprising another of the low-pass filter, high-pass filter and notch filter including another first differentially operative circuit, another capacitor and another second differentially operative circuit, substantially identical to the first mentioned first differentially operative circuit, capacitor and second differentially operative circuit all connected so that the frequency response of at least two separate filters is commonly adjusted by a single means for trimming.

26. A filter according to claim 25, wherein said second differentially operative circuit has a time constant defined by a capacitance times a resistance times a value proportional to the adjustably determined resistance of said at least one load resistor means that directly determine the frequency response.

27. A device according to claim 26, wherein said means for trimming increases the time constant.

* * * * *